(12) United States Patent
Kondo

(10) Patent No.: US 10,644,647 B2
(45) Date of Patent: May 5, 2020

(54) OSCILLATOR, AN ELECTRONIC APPARATUS, AND A VEHICLE

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 230 days.

(21) Appl. No.: 15/622,274

(22) Filed: Jun. 14, 2017

(65) Prior Publication Data

US 2017/0373637 A1  Dec. 28, 2017

(30) Foreign Application Priority Data

Jun. 27, 2016  (JP) ................. 2016-126627

(51) Int. Cl.
| | |
|---|---|
| *H03B 5/04* | (2006.01) |
| *H03H 9/05* | (2006.01) |
| *H03H 9/08* | (2006.01) |
| *H03H 9/02* | (2006.01) |
| *H03H 9/10* | (2006.01) |
| *H03B 5/02* | (2006.01) |
| *H03L 1/02* | (2006.01) |
| *H03B 1/02* | (2006.01) |
| *H03B 5/32* | (2006.01) |

(52) U.S. Cl.
CPC ............. *H03B 5/04* (2013.01); *H03B 1/02* (2013.01); *H03B 5/02* (2013.01); *H03B 5/32* (2013.01); *H03H 9/02102* (2013.01); *H03H 9/0519* (2013.01); *H03H 9/0547* (2013.01); *H03H 9/08* (2013.01); *H03H 9/1021* (2013.01); *H03L 1/028* (2013.01); *H01L 2224/48091* (2013.01); *H01L 2924/16195* (2013.01)

(58) Field of Classification Search
CPC ... H03B 5/02; H03B 5/32; H03B 5/04; H03B 1/02; H03B 1/00; H03L 1/028; H03H 9/0547; H03H 9/0519; H03H 9/02102; H03H 9/1021
USPC ........................................ 331/158, 176, 68
See application file for complete search history.

(56) References Cited

U.S. PATENT DOCUMENTS

| | | | |
|---|---|---|---|
| 7,345,552 B2 * | 3/2008 | Ito ............................ | H03B 5/04 331/158 |
| 2015/0116052 A1 * | 4/2015 | Kikushima .......... | H03H 9/0552 331/158 |
| 2015/0280101 A1 | 10/2015 | Kondo | |

FOREIGN PATENT DOCUMENTS

| | | |
|---|---|---|
| JP | H01-173787 A | 7/1989 |
| JP | H05-90870 A | 4/1993 |
| JP | 2005-39435 A | 2/2005 |
| JP | 2005-333315 A | 12/2005 |
| JP | 2011-217302 A | 10/2011 |
| JP | 2013-5364 A | 1/2013 |

(Continued)

*Primary Examiner* — Arnold M Kinkead
(74) *Attorney, Agent, or Firm* — Oliff PLC

(57) ABSTRACT

An oscillator includes a first package including a first base, and a first lid bonded to the first base, a first temperature controller housed in the first package, and mounted on the first base, a second temperature controller housed in the first package, and mounted on the first base, and a circuit element housed in the first package, mounted on the first base, and including at least a part of an oscillation circuit, the circuit element is disposed between the first temperature controller and the second temperature controller in a planar view.

18 Claims, 14 Drawing Sheets

(56) References Cited

FOREIGN PATENT DOCUMENTS

| | | |
|---|---|---|
| JP | 2015-173315 A | 10/2015 |
| JP | 2015-186108 A | 10/2015 |
| JP | 2015-228609 A | 12/2015 |

\* cited by examiner

OSCILLATOR, AN ELECTRONIC APPARATUS, AND A VEHICLE

CROSS-REFERENCE TO RELATED APPLICATIONS

This application claims priority to Japanese Patent Application No. 2016-126627, filed Jun. 27, 2016, the entirety of which is hereby incorporated by reference.

BACKGROUND

1. Technical Field

The present disclosure relates to an oscillator, an electronic apparatus, and a vehicle.

2. Related Art

As described in JP-A-2015-186108, in the past, there has been known an oven-controlled crystal oscillator (OCXO) as an oscillator using a quartz crystal resonator element. The oscillator described in JP-A-2015-186108 includes a package, and a resonator element, a heater and a circuit element housed in the package.

However, in the oscillator described in JP-A-2015-186108, the resonator element and the heater are fixed to the package via a mount plate, and the circuit element is fixed to the package without the intervention of the mount plate. Therefore, the transfer path of the heat from the heater to the circuit element becomes long, and there is a possibility that the circuit element cannot efficiently be heated by the heater. Therefore, it becomes easy to be affected by the external temperature fluctuation.

SUMMARY

An advantage of the disclosure is to provide an oscillator, an electronic apparatus, and a vehicle hard to be affected by the external temperature fluctuation.

The disclosure can be implemented as the following application examples.

An oscillator according to this application example includes a first package including a first base, and a first lid bonded to the first base, a first temperature controller and a second temperature controller housed in the first package, and mounted on the first base, and a circuit element housed in the first package, mounted on the first base, and including at least a part of an oscillation circuit, and the circuit element is disposed between the first temperature controller and the second temperature controller in a planar view of the first package.

By disposing the circuit element between the first temperature controller and the second temperature controller as described above, it is possible to efficiently heat the circuit element using the first temperature controller and the second temperature controller. Therefore, the oscillator hard to be affected by the external temperature fluctuation is obtained.

An oscillator according to this application example includes a first package including a first base, and a first lid bonded to the first base, a first temperature controller and a second temperature controller housed in the first package, and fixed to the first base, and a circuit element housed in the first package, fixed to the first base, and including at least a part of an oscillation circuit, and defining a distance between the circuit element and the first temperature controller as L1, a distance between the circuit element and the second temperature controller as L2, and a distance between the first temperature controller and the second temperature controller as L3 in a planar view of the first package, relationships of L1<L3 and L2<L3 are satisfied.

According to this application example, the circuit element can efficiently be heated by the first temperature controller and the second temperature controller. Therefore, the oscillator hard to be affected by the external temperature fluctuation is obtained.

In the oscillator according to the application example, it is preferable that defining a distance between the circuit element and the first temperature controller as L1, and a distance between the circuit element and the second temperature controller as L2, a relationship of $0.9 \leq L1/L2 \leq 1.1$ is satisfied in a planar view of the first package.

According to this application example, it is possible to roughly evenly transfer the heat of the first and second temperature controller to the circuit element to thereby evenly and efficiently heat the circuit element.

In the oscillator according to the application example, it is preferable that there are further included a second package housed in the first package, and an oscillation element housed in the second package, the second package is mounted on the first temperature controller and the second temperature controller via fixation members, and at least a part of the circuit element is located between the second package and the first base.

According to this application example, it is possible to heat the second package with the first and second temperature controllers, and it is possible to heat the circuit element with the heat of the second package. Therefore, the circuit element can more efficiently be heated.

In the oscillator according to the application example, it is preferable that the second package includes a second base on which the oscillation element is mounted, a second lid bonded to the second base so as to house the oscillation element between the second base and the second lid, and a sealing ring disposed between the second base and the second lid, and adapted to bond the second base and the second lid to each other, and the sealing ring is disposed so as to surround at least a part of the circuit element in the planar view of the first package.

According to this application example, the circuit element can more efficiently be heated.

In the oscillator according to the application example, it is preferable to further include a third temperature controller and a fourth temperature controller housed in the second package.

According to this application example, the resonator element and the circuit element can be heated using the third and fourth temperature controllers.

In the oscillator according to the application example, it is preferable that the circuit element is disposed between the third temperature controller and the fourth temperature controller in the planar view of the first package.

According to this application example, the circuit element can efficiently be heated using the third and fourth temperature controllers.

In the oscillator according to the application example, it is preferable that in the planar view of the first package, the first temperature controller and the second temperature controller are arranged side by side along a first direction, and the third temperature controller and the fourth temperature controller are arranged side by side along a second direction crossing the first direction.

According to this application example, the circuit element can efficiently be heated.

In the oscillator according to the application example, it is preferable that the first package and the second package are each airtightly sealed.

According to this application example, the oscillator becomes harder to be affected by the external temperature fluctuation.

In the oscillator according to the application example, it is preferable to further include an interconnection substrate, and a flexible substrate adapted to support the first package, and connected to the interconnection substrate.

According to this application example, the reliability of the mechanical and electrical connection between the flexible substrate and the first package and between the interconnection substrate and the flexible substrate is improved.

In the oscillator according to the application example, it is preferable to further include a third package adapted to house the interconnection substrate, the flexible substrate, and the first package.

According to this application example, the first package can be protected. Further, for example, by setting the third package in a reduced-pressure state, the oscillator harder to be affected by the external temperature fluctuation is obtained.

In the oscillator according to the application example, it is preferable to further include a pin electrically connected to the interconnection substrate, adapted to fix the interconnection substrate to the third package, and disposed so as to penetrate the third package.

According to this application example, the electrical connection to the outside becomes easy.

An electronic apparatus according to this application example includes the oscillator according to any one of the application examples described above.

According to this application example, the electronic apparatus high in reliability can be obtained.

A vehicle according to this application example includes the oscillator according to anyone of the application examples described above.

According to this application example, the vehicle high in reliability can be obtained.

BRIEF DESCRIPTION OF THE DRAWINGS

The disclosure will now be described with reference to the accompanying drawings, wherein like numbers reference like elements.

DESCRIPTION OF EXEMPLARY EMBODIMENTS

Hereinafter, an oscillator, an electronic apparatus, and a vehicle according to the disclosure will be described in detail based on some embodiments shown in the accompanying drawings.

First Embodiment

Figure 1:
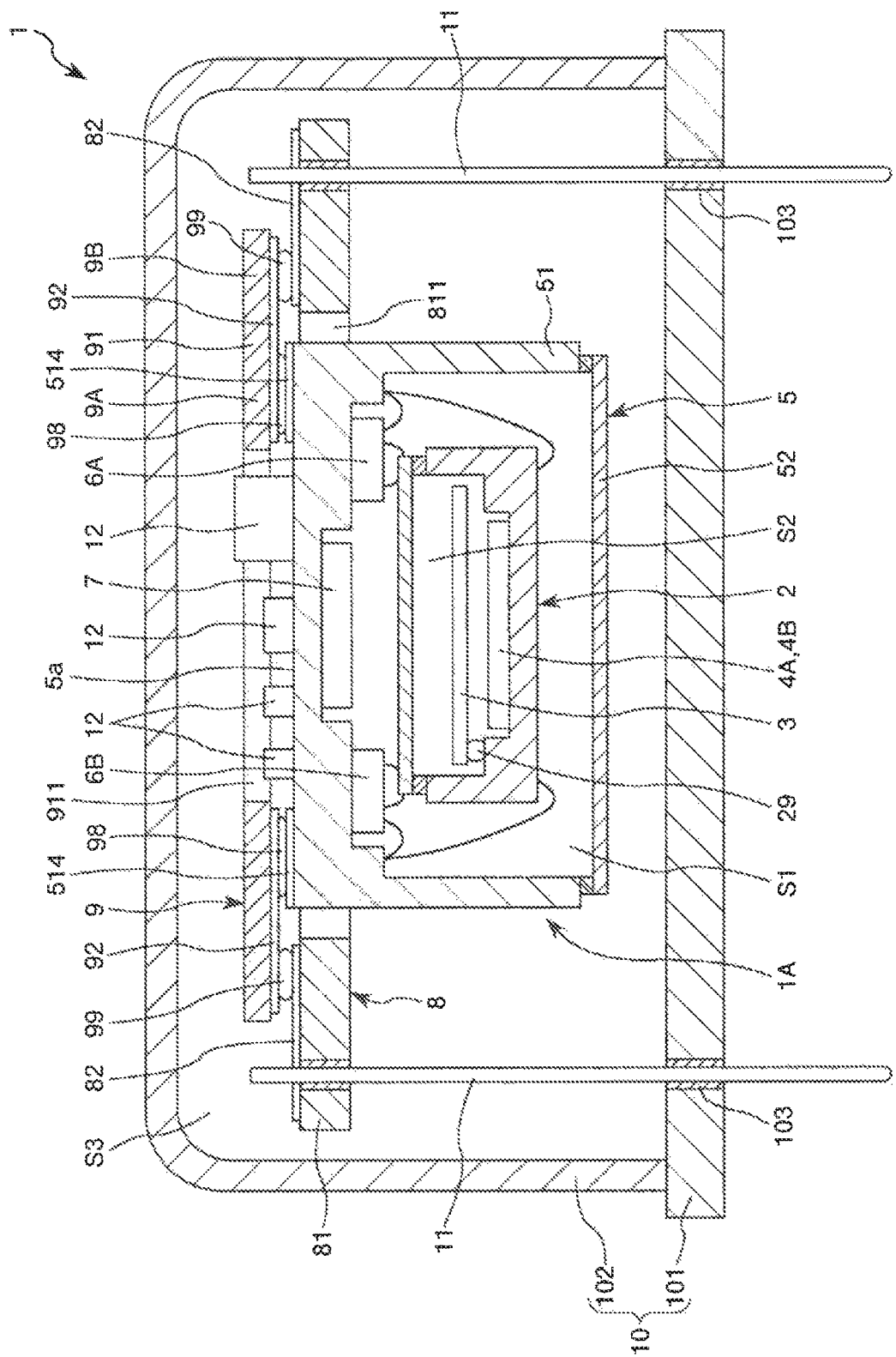
FIG. 1 is a cross-sectional view of an oscillator according to a first embodiment.
Figure 2:
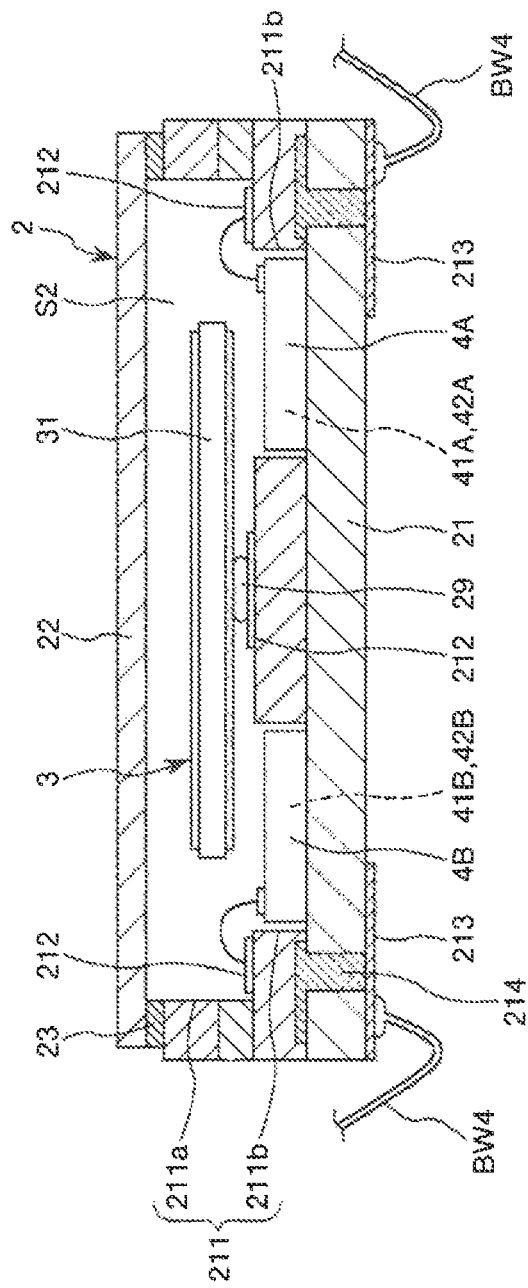
FIG. 2 is a cross-sectional view of a second package provided to the oscillator shown in FIG. 1.
Figure 3:
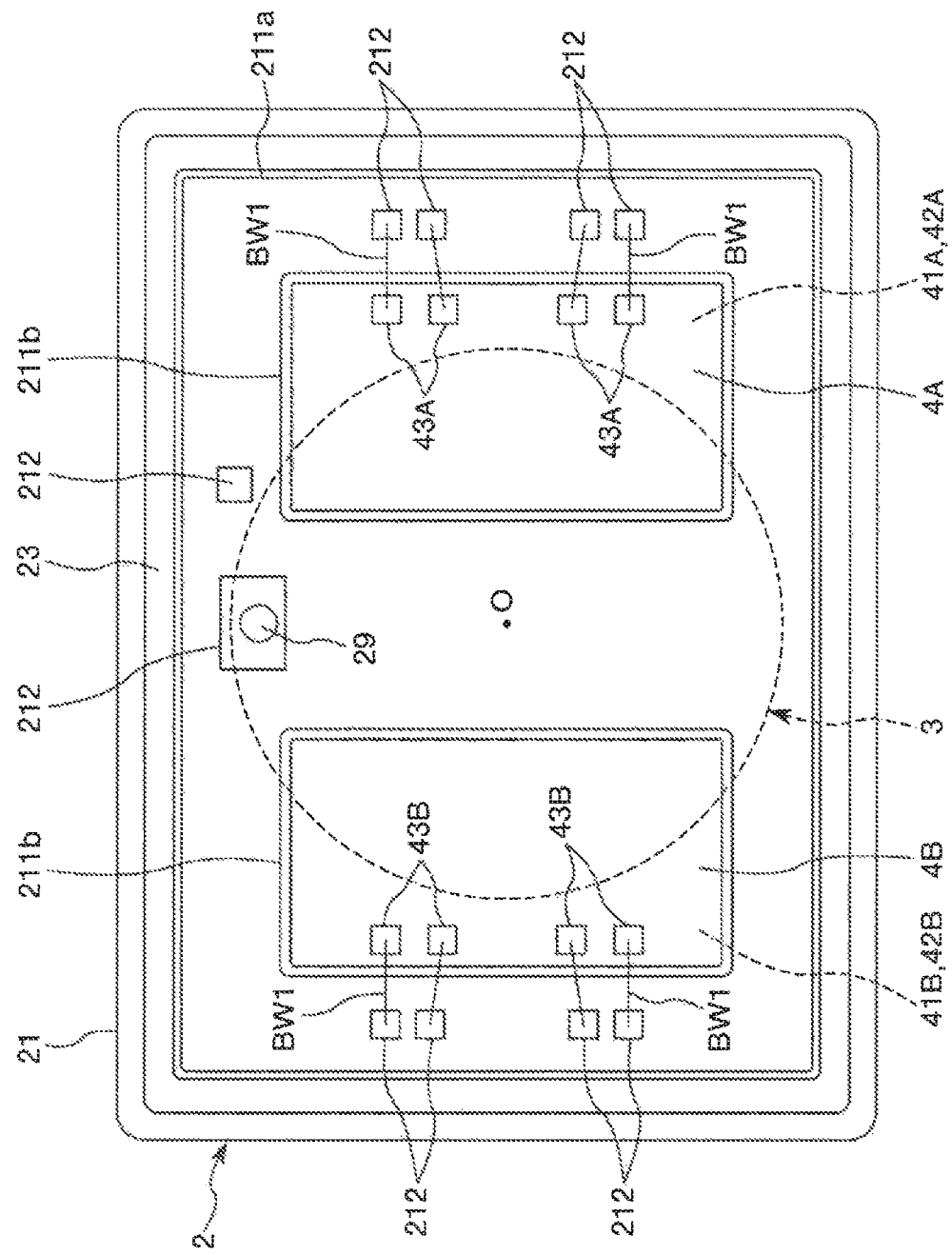
FIG. 3 is a plan view of the second package shown in FIG. 2.
Figure 4:
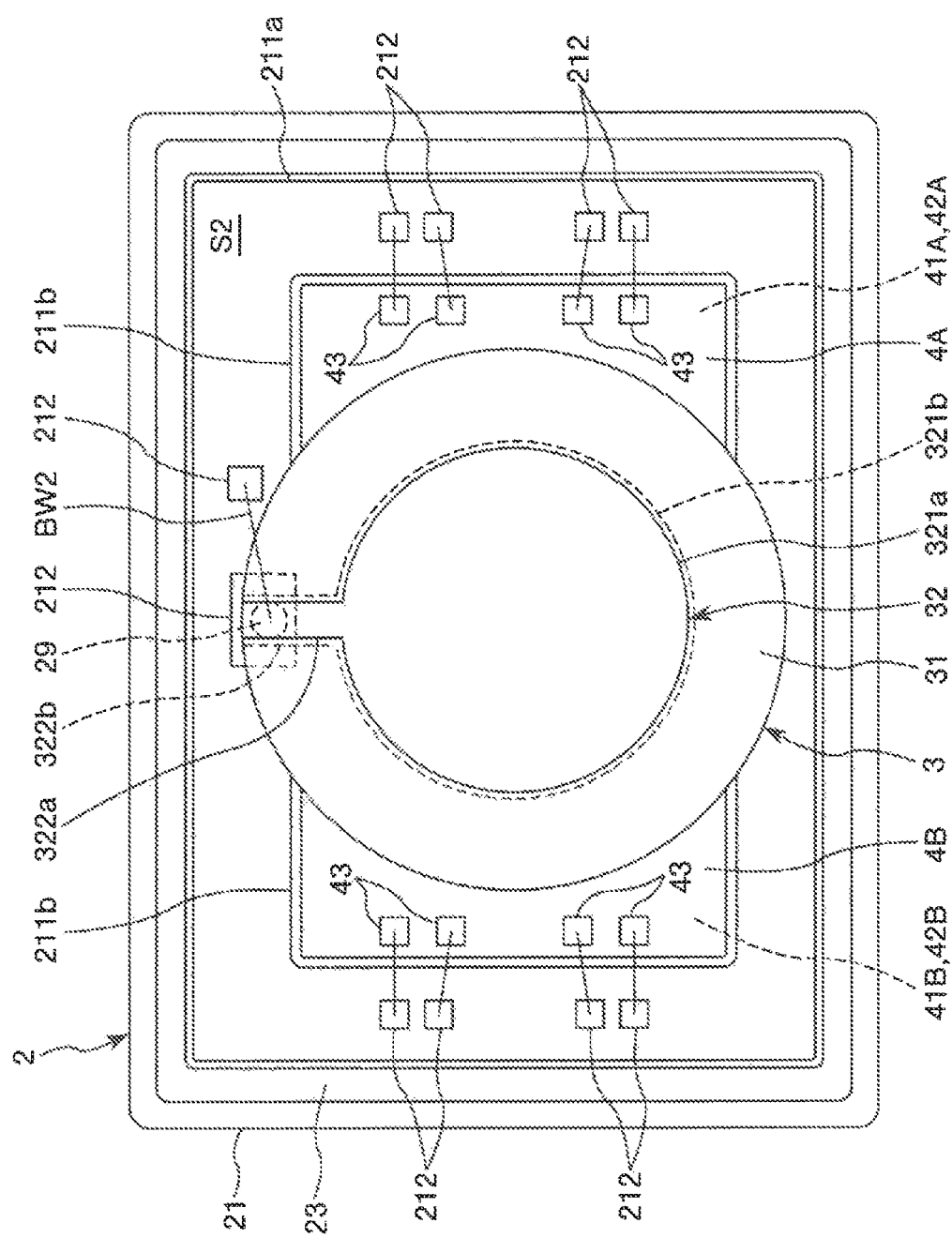
FIG. 4 is a plan view of the second package shown in FIG. 2.
Figure 5:
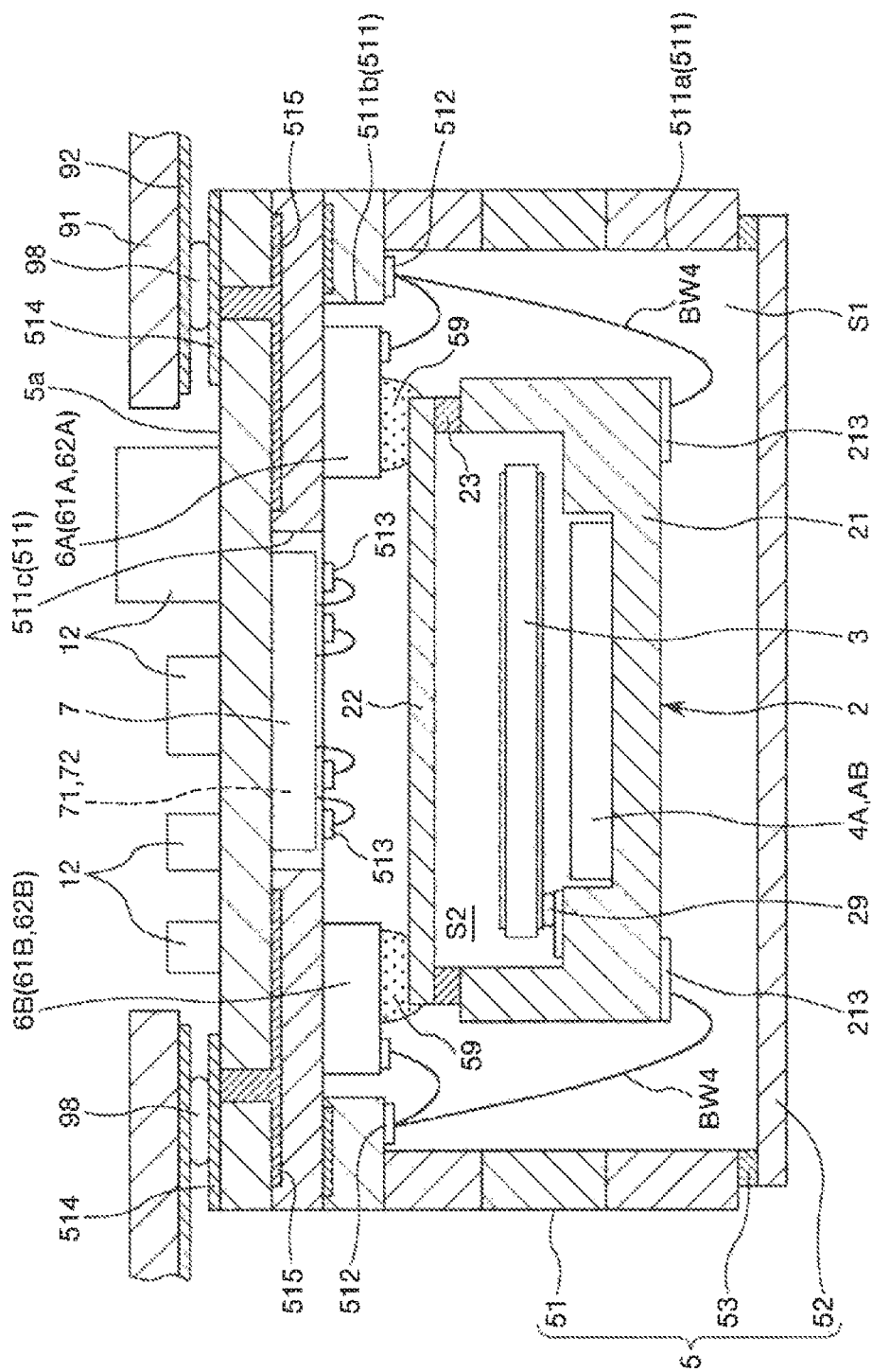
FIG. 5 is a cross-sectional view of a first package provided to the oscillator shown in FIG. 1.
Figure 6:
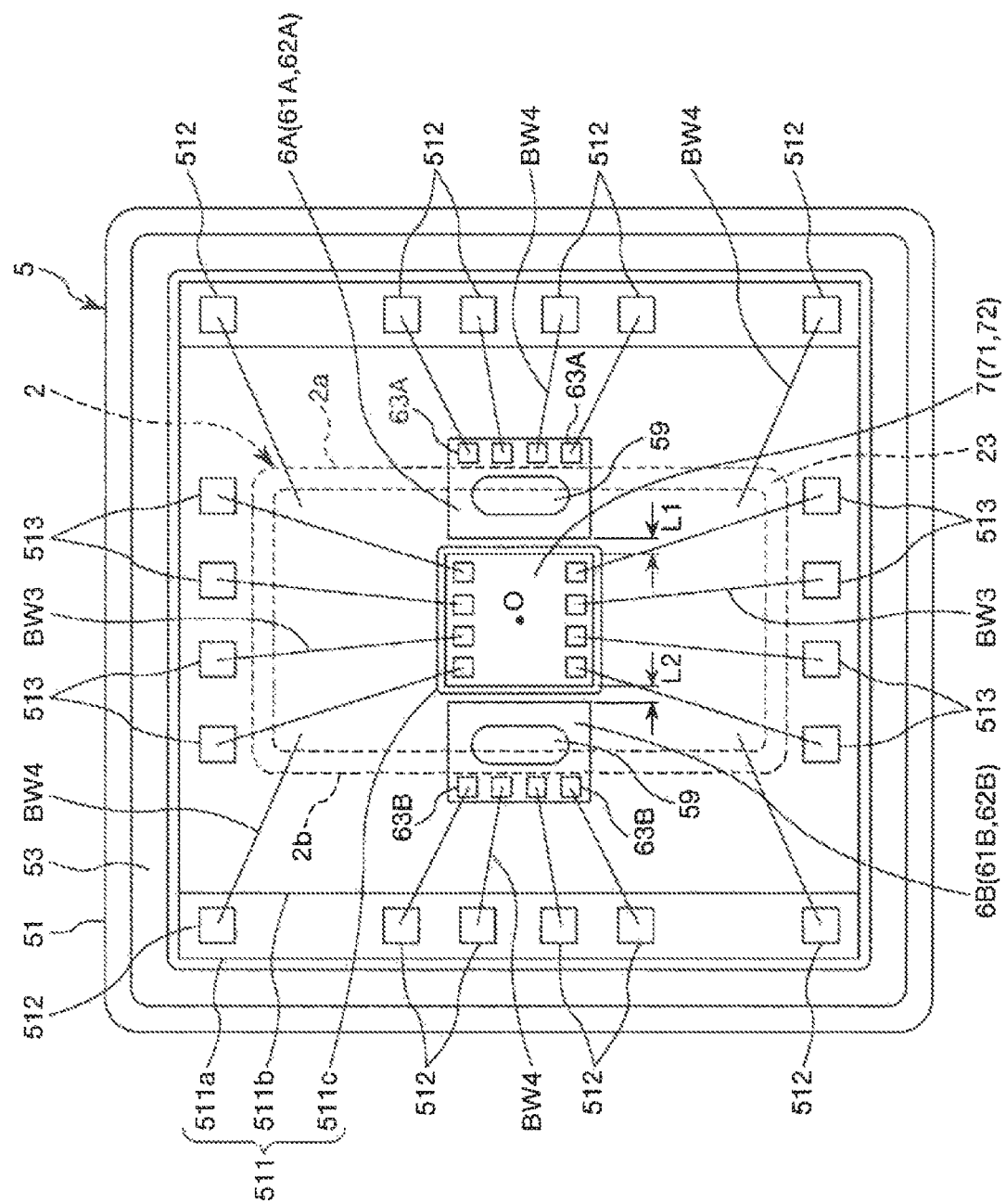
FIG. 6 is a plan view of the first package shown in FIG. 5.
Figure 7:
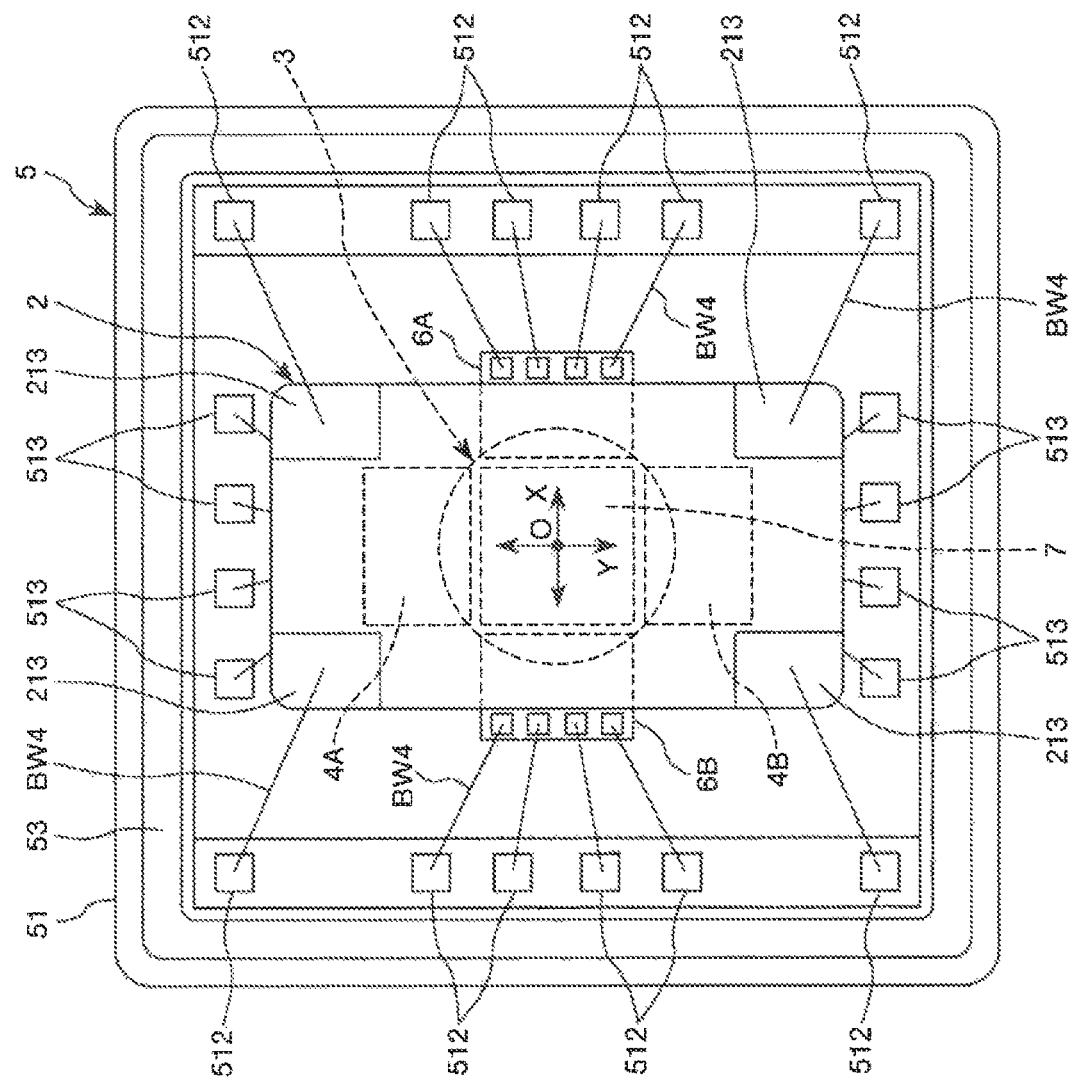
FIG. 7 is a plan view of the first package shown in FIG. 5.

FIG. 1 is a cross-sectional view of an oscillator according to a first embodiment. FIG. 2 is a cross-sectional view of a second package provided to the oscillator shown in FIG. 1. FIG. 3 and FIG. 4 are each a plan view of the second package shown in FIG. 2. FIG. 5 is a cross-sectional view of a first package provided to the oscillator shown in FIG. 1. FIG. 6 and FIG. 7 are each a plan view of the first package shown in FIG. 5. It should be noted that the upper side of FIG. 1 is also referred to as an "upper side," and the lower side thereof is also referred to as a "lower side" in the following descriptions for the sake of convenience of explanation.

As shown in FIG. 1, the oscillator 1 is an OCXO (oven-controlled crystal oscillator). Such an oscillator 1 includes a first package 5 having a first base 51 and a first lid 52 bonded to the first base 51, a first heating element 6A as a first temperature controller and a second heating element 6B as a second temperature controller both housed in the first package 5 and at the same time mounted on the first base 51, and a circuit element 7, which is housed in the first package 5, mounted on the first base 51, and includes at least apart of an oscillation circuit. Further, the circuit element 7 is disposed between the first heating element 6A and the second heating element 6B in a planar view (a planar view viewed in the thickness direction of the first package 5) of the first package 5. According to the oscillator 1 having such a configuration, since the circuit element 7 is disposed between the first and second heating elements 6A, 6B, it is possible to efficiently heat the circuit element 7 using the first and second heating elements 6A, 6B. Therefore, it becomes possible to reduce the variation from a predetermined temperature of the circuit element 7, and thus, the oscillator 1 hard to be affected by the external temperature fluctuation and high in reliability is obtained. Hereinafter, such an oscillator 1 will be described in detail.

As shown in FIG. 1, the oscillator 1 includes the first package 5, the first and second heating elements 6A, 6B and the circuit element 7 all housed in the first package 5, the second package 2 housed in the first package 5, the resonator element 3 as an oscillation element housed in the second package 2, a third heating element 4A as a third temperature controller and a fourth heating element 4B as a fourth temperature controller, circuit components 12 disposed on the upper surface 5a of the first package 5, an interconnection substrate 8, a flexible substrate 9, which supports the first package 5 and is connected to the interconnection substrate 8, a third package 10 housing the interconnection substrate 8, the flexible substrate 9 and the first package 5, and a plurality of pins 11, which are electrically connected to the interconnection substrate 8, and are disposed so as to fix the interconnection substrate 8 to the third package 10 and penetrate the third package 10.

Second Package

FIG. 2 is a cross-sectional view of the second package 2. As shown in FIG. 2, the second package 2 includes a second base 21 on which the resonator element 3 and the third and fourth heating elements 4A, 4B are mounted, a second lid 22 disposed bonded to the second base 21 so as to house the resonator element 3 and the third and fourth heating elements 4A, 4B between the second base 21 and the second lid 22, and a sealing ring 23 having a frame-like shape disposed between the second base 21 and the second lid 22 to bond the second base 21 and the second lid 22 to each other.

The second base 21 has a cavity shape having a recess 211 opening on the upper surface, and has a roughly rectangular shape in a planar view as shown in FIG. 3. Further, the recess 211 includes a first recess 211a opening in the upper surface of the second base 21, and two second recesses 211b opening in the bottom surface of the first recess 211a. Further, the two second recesses 211b are arranged side by side in the longitudinal direction of the second base 21, and are disposed on respective sides opposite to each other with respect to the center O of the second package 2 in a planar view of the second package 2.

In contrast, the second lid 22 has a plate-like shape, and is bonded to the upper surface of the second base 21 via the sealing ring 23 so as to cover the opening of the recess 211. The sealing ring 23 has a frame-like shape, and is located between the upper surface of the second base 21 and the second lid 22. Such a sealing ring 23 is formed of a metal material, and by the sealing ring 23 melting, the second base 21 and the second lid 22 are airtightly bonded to each other. As described above, a second housing space S2 is created by covering the opening of the recess 211 with the second lid 22, and houses the resonator element 3 and the third and fourth heating elements 4A, 4B.

The second package 2 is airtightly sealed, and the second housing space S2 is in a reduced-pressure state (e.g., no higher than 10 Pa, or preferably a vacuum state). Thus, it is possible to continue stable drive of the resonator element 3. Further, the second housing space S2 functions as a heat-insulating layer, and the oscillator 1 harder to be affected by the external temperature fluctuation is obtained. It should be noted that the atmosphere in the second housing space S2 is not particularly limited, but can be filled with an inert gas such as nitrogen or argon to be at the atmospheric pressure.

The constituent material of the second base 21 is not particularly limited, but a variety of types of ceramics such as aluminum oxide can be used. In this case, by calcining a stacked body of ceramic sheets (green sheets), the second base 21 can be manufactured. Further, the constituent material of the second lid 22 is not particularly limited, but a member with a linear expansion coefficient similar to that of the constituent material of the second base 21 is preferable. For example, in the case in which the ceramics described above is used as the constituent material of the second base 21, it is preferable to use a metal material (an alloy such as Kovar) as the constituent material of the second lid 22.

Further, the second base 21 includes a plurality of internal terminals 212 disposed on the bottom surface of the first recess 211a, and a plurality of external terminals 213 disposed on the bottom surface (the lower surface of the second package 2) of the second base 21. The internal terminals 212 are electrically connected to the resonator element 3 and the third and fourth heating elements 4A, 4B via bonding wires BW1, BW2, respectively. Further, the internal terminals 212 are electrically connected to the external terminals 213 via the internal interconnections 214 embedded in the second base 21.

Third and Fourth Heating Elements

As shown in FIG. 3, the oscillator 1 includes the third heating element 4A and the fourth heating element 4B housed in the second package 2 and fixed to the second base 21. The third heating element 4A is fixed to the bottom surface of one of the second recesses 211b via an adhesive or the like, and the fourth heating element 4B is fixed to the bottom surface of the other of the second recesses 211b via an adhesive or the like. Therefore, the third and fourth heating elements 4A, 4B are disposed on the respective sides opposite to each other with respect to the center O of the second package 2 in the planar view of the second package 2. Such third and fourth heating elements 4A, 4B are each an electronic component having a so-called "constant-temperature function" for heating the resonator element 3 and the circuit element 7 to keep the temperature of the resonator element 3 and the circuit element roughly constant. By keeping the temperature of the resonator element 3 and the circuit element 7 roughly constant, it is possible to suppress the fluctuation of the frequency due to the temperature fluctuation in the outside (usage environment), and thus, the oscillator 1 having excellent frequency stability is realized. It should be noted that in the oscillator 1, it is preferable to control the temperature of the resonator element 3 so as to approach a peak temperature (e.g., roughly 70° C. through 100° C. although different by the specification) representing zero temperature coefficient. Thus, it is possible to exert more excellent frequency stability.

Such third and fourth heating elements 4A, 4B include, for example, heating circuits 41A, 41B each provided with a power transistor, and temperature detection circuits 42A, 42B each formed of a diode or a thermistor, respectively, so that the temperature of the heating circuit 41A and the temperature of the heating circuit 41B are controlled based on the output from the temperature detection circuits 42A, 42B, respectively, to be able to keep the resonator element 3 and the circuit element 7 constant in temperature. It should be noted that the configurations of the heating circuits 41A, 41B and the temperature detection circuits 42A, 42B are not particularly limited. For example, the temperature detection circuits 42A, 42B can be made separated from the third and fourth heating elements 4A, 4B.

Further, a plurality of terminals 43A and a plurality of terminals 43B are disposed on the upper surfaces of the third and fourth heating elements 4A, 4B, respectively, and these terminals 43A, 43B are electrically connected to the internal terminals 212 via respective bonding wires BW1.

Resonator Element

As shown in FIG. 4, the resonator element 3 is disposed in the second housing space S2, and is fixed to the internal terminal 212 disposed on the bottom surface of the first recess 211a of the second base 21 via the fixation member 29 having electrical conductivity. Such a resonator element 3 includes a quartz crystal substrate 31, and electrodes 32 disposed on the quartz crystal substrate 31.

The quartz crystal substrate 31 is what is obtained by shaping an SC-cut quartz crystal substrate into a roughly circular planar shape by mechanical processing and so on. By using the SC-cut quartz crystal substrate, it is possible to obtain the resonator element 3, which is small in frequency jump or rise in resistance due to a spurious vibration, and is stable in temperature characteristic. It should be noted that the planar shape of the quartz crystal substrate 31 is not limited to a circular shape, but can also be a nonlinear shape such as an elliptical shape or an oval shape, or can also be a linear shape such as a triangular shape or rectangular shape. It should be noted that by shaping the quartz crystal substrate 31 into a circular shape as in the present embodiment, symmetry of the quartz crystal substrate 31 is improved, and it is possible to effectively suppress the oscillation in sub-vibration (spurious vibration) mode.

The electrodes 32 include a first excitation electrode 321a and a first extraction electrode 321b disposed on the upper surface of the quartz crystal substrate 31, and a second excitation electrode 322a and a second extraction electrode 322b disposed on the lower surface of the quartz crystal substrate 31.

Such a resonator element 3 is fixed to the internal terminal 212 in the outer edge part thereof via the fixation member 29 having electrical conductivity. The fixation member 29 bonds the second base 21 and the resonator element 3 to each other, and at the same time, electrically connects the internal terminal 212 and the second extraction electrode 322b to each other, and further thermally connects the second base 21 and the resonator element 3 to each other. On the other hand, the first extraction electrode 321b is electrically connected to another of the internal terminals 212 via the bonding wire BW2.

The fixation member 29 is not particularly limited providing both of electrical conductivity and a bonding property are provided, and there can be used, for example, a metal bonding material (e.g., a silver paste, or a copper paste), an alloy bonding material (e.g., a bump made of a gold-tin alloy or solder), and an electrically-conductive adhesive (e.g., a polyimide series adhesive having metal particles such as silver filler dispersed).

As shown in FIG. 4, the resonator element 3 is disposed between the third and fourth heating elements 4A, 4B in a planar view of the second package 2. Specifically, the center of the resonator element 3 is located between the third and fourth heating elements 4A, 4B in the planar view of the second package 2. Further, the fixation member 29 is disposed at a position where the distances from the third and fourth heating elements 4A, 4B are roughly equal to each other. Therefore, it is possible to equally transfer the heat of the third and fourth heating elements 4A, 4B to the resonator element 3, and thus, it is possible to efficiently and evenly heat the resonator element 3.

Further, the resonator element 3 is disposed so as to partially overlap each of the third and fourth heating elements 4A, 4B. Thus, it is possible to decrease the distance between the resonator element 3 and each of the third and fourth heating elements 4A, 4B, and it is also possible to efficiently heat the resonator element 3 with the heat radiation from the third and fourth heating elements 4A, 4B.

First Package

As shown in FIG. 5, the first package 5 includes a first base 51 to which the first and second heating elements 6A, 6B and the circuit element 7 are fixed, a first lid 52 bonded to the lower surface of the first base 51 so as to house the first and second heating elements 6A, 6B, the circuit element 7, and the second package 2 between the first base 51 and the first lid 52, and a sealing ring 53 disposed between the first base 51 and the first lid 52 to bond the first base 51 and the first lid 52 to each other.

The first base 51 has a cavity shape having a recess 511 opening on the lower surface, and has a roughly square shape in a planar view as shown in FIG. 6. Further, the recess 511 includes a first recess 511a opening on the lower surface of the first base 51, a second recess 511b opening on the bottom surface of the first recess 511a, and a third recess 511c opening on the bottom surface of the second recess 511b. In contrast, the first lid 52 has a plate-like shape, and is bonded to the lower surface of the first base 51 via the sealing ring 53 so as to cover the opening of the recess 511. The sealing ring 53 has a frame-like shape, and is located between the lower surface of the first base 51 and the first lid 52. Such a sealing ring 53 is formed of a metal material, and by the sealing ring 53 melting, the first base 51 and the first lid 52 are airtightly bonded to each other. As described above, a first housing space S1 is created by covering the opening of the recess 511 with the first lid 52, and the first and second heating elements 6A, 6B, the circuit element 7 and the second package 2 are housed in the first housing space S1.

The first package 5 is airtightly sealed, and the first housing space S1 is in a reduced-pressure state (e.g., no higher than 10 Pa, or preferably a vacuum state). Thus, it is possible to make the first housing space S1 function as a heat-insulating layer, and the oscillator 1 is made harder to be affected by the external temperature fluctuation. It should be noted that the atmosphere in the first housing space S1 is not particularly limited.

The constituent material of the first base 51 is not particularly limited, but a variety of types of ceramics such as aluminum oxide can be used. In this case, by calcining a stacked body of ceramic sheets (green sheets), the first base 51 can be manufactured. Further, the constituent material of the first lid 52 is not particularly limited, but a member with a linear expansion coefficient similar to that of the constituent material of the first base 51 is preferable. For example, in the case in which the ceramics described above is used as the constituent material of the first base 51, it is preferable to use a metal material (an alloy such as Kovar) as the constituent material of the first lid 52.

Further, the first base 51 includes a plurality of internal terminals 512 disposed on the bottom surface of the first recess 511a, a plurality of internal terminals 513 disposed on the bottom surface of the second recess 511b, and a plurality of external terminals 514 disposed on the bottom surface (the upper surface of the first package 5) of the first base 51. The internal terminals 512 are electrically connected to the external terminals 213 of the second package 2 and the first and second heating elements 6A, 6B via bonding wires BW4, respectively, and the internal terminals 513 are electrically connected to the circuit element 7 via bonding wires BW3, respectively. Further, the internal terminals 512, 513 are electrically connected to each other via internal interconnections 515 embedded in the first base 51, or electrically connected to the external terminals 514.

First and Second Heating Elements

As shown in FIG. 5, the oscillator 1 includes the first heating element 6A and the second heating element 6B each fixed to the bottom surface of the second recess 511b via an adhesive or the like. Such first and second heating elements 6A, 6B are each an electronic component having a so-called "constant-temperature function" for heating the circuit element 7 and at the same time heating the resonator element 3 to keep the temperature of the circuit element 7 and the resonator element 3 roughly constant.

As described above, the oscillator 1 has the first, second, third, and fourth heating elements 6A, 6B, 4A, and 4B, and can therefore strongly heat the circuit element 7 and the resonator element 3. Therefore, even in the case in which the external temperature changes rapidly, the temperature of the circuit element 7 and the resonator element 3 can more surely be kept constant (in other words, the temperature fluctuation of the circuit element 7 and the resonator element 3 can be reduced). Since the circuit element 7 and the resonator element 3 each have a temperature-dependent characteristic (a property that the characteristic varying with the temperature), by keeping these elements constant in temperature, the frequency fluctuation can effectively be suppressed, and there is obtained the oscillator 1 having excellent frequency stability and therefore high in reliability.

As shown in FIG. 6, the first and second heating elements 6A, 6B are disposed so that the circuit element 7 is located between the first and second heating elements 6A, 6B in a planar view of the first package 5. Therefore, it is possible to heat the circuit element 7 evenly from the both sides using the first and second heating elements 6A, 6B, and thus it is possible to more accurately keep the temperature of the circuit element 7 constant. Here, defining the distance between the circuit element 7 and the first heating element 6A as L1, and the distance between the circuit element 7 and the second heating element 6B as L2 in the planar view of the first package 5, it is preferable to satisfy the relationship of $0.9 \leq L1/L2 \leq 1.1$, and it is more preferable to satisfy the relationship of $0.95 \leq L1/L2 \leq 1.05$. By satisfying such relationships, it is possible to roughly evenly transfer the heat of the first and second heating elements 6A, 6B to the circuit element 7 to thereby more efficiently and evenly heat the circuit element 7.

Similarly to the third and fourth heating elements 4A, 4B, such first and second heating elements 6A, 6B include, for example, heating circuits 61A, 61B each provided with a power transistor, and temperature detection circuits 62A, 62B each formed of a diode or a thermistor, respectively, so that the temperature of the heating circuit 61A and the temperature of the heating circuit 61B are controlled based on the output from the temperature detection circuits 62A, 62B, respectively, to be able to keep the circuit element 7 and the resonator element 3 constant in temperature. It should be noted that the configurations of the heating circuits 61A, 61B and the temperature detection circuits 62A, 62B are not particularly limited.

As shown in FIG. 6, a plurality of terminals 63A and a plurality of terminals 63B are disposed on the surfaces of the first and second heating elements 6A, 6B, respectively, and the terminals 63A, 63B are electrically connected to the internal terminals 512 via the bonding wires BW4, respectively.

As shown in FIG. 5 and FIG. 6, the second package 2 is fixed to the first and second heating elements 6A, 6B. Specifically, the second package 2 is mounted on the lower surfaces of the first heating element 6A and the second heating element 6B via fixation members 59, respectively. As described above, by fixing the second package 2 to the first and second heating elements 6A, 6B, it is possible to efficiently transfer the heat of the first and second heating elements 6A, 6B to the resonator element 3 via the second package 2. Therefore, it becomes easy to keep the temperature of the resonator element 3 constant, and at the same time the power consumption can be reduced. Further, the second package 2 is disposed so as to hold the circuit element 7 in the space with the first base 51, and at least apart of the circuit element 7 is located between the second package 2 and the first base 51. Thus, it is possible to heat the circuit element 7 also by the first base 51 and the second package 2 heated by the first and second heating elements 6A, 6B. Therefore, it is possible to heat the circuit element 7 from vertical and horizontal directions (from the horizontal directions by the first and second heating elements 6A, 6B, and from the vertical directions by the first base 51 and the second package 2). Therefore, the circuit element 7 can more efficiently and evenly be heated. In particular, in the present embodiment, since the entire area of the circuit element 7 is located between the second package 2 and the first base 51, the advantage described above becomes more conspicuous.

Further, as shown in FIG. 5, the second package 2 is disposed so that the second lid 22 is located on the first and second heating elements 6A, 6B side, and is fixed to the first and second heating elements 6A, 6B in the second lid 22. As described above, the second lid 22 can be formed of an alloy such as Kovar, and the thermal conductivity can be raised to a level higher than that of the second base 21. Therefore, the heat of the first and second heating elements 6A, 6B can more efficiently be transferred to the second package 2. As described above, by directly heating the second lid 22 high in thermal conductivity using the first and second heating elements 6A, 6B, it is possible to more efficiently heat the circuit element 7. Further, since the heat of the second lid 22 is evenly and stably transferred to the resonator element 3 via the second base 21, it is also possible to more accurately keep the temperature of the resonator element 3.

Further, as shown in FIG. 6, the first and second heating elements 6A, 6B are disposed on the respective sides opposite to each other with respect to the center O of the second package 2 in the planar view of the second package 2. Further, in the planar view of the second package 2, the first heating element 6A is disposed so as to overlap one long side 2a of the second package 2, and the second heating elements 6B is disposed so as to overlap the other long side 2b of the second package 2. Further, in the planar view of the second package 2, the center of the resonator element 3 and the center of the circuit element 7 are disposed so as to overlap each other, and the distance between the first heating element 6A and the resonator element 3 and the distance between the second heating element 6B and the resonator element 3 are made roughly equal to each other. By arranging the first and second heating elements 6A, 6B in such a manner, since the heat of the first and second heating elements 6A, 6B is roughly evenly transferred to the resonator element 3 via the second package 2, it is possible to evenly and efficiently heat the resonator element 3 with the first and second heating elements 6A, 6B.

Further, in the planar view of the second package 2, the sealing ring 23 is disposed so as to surround at least apart of the circuit element 7. In particular, in the present embodiment, the sealing ring 23 is disposed so as to surround the entire periphery of the circuit element 7. By adopting such an arrangement, it is possible to make the second package 2 (the second lid 22) overlap the entire area of the circuit element 7 in the planar view of the second package 2, it is possible to efficiently heat the circuit element 7 with the heat of the second package 2.

Further, as shown in FIG. 7, the circuit element 7 is disposed between the third heating element 4A and the fourth heating elements 4B in the planar view of the first package 5. Specifically, the center of the circuit element 7 is located between the third heating element 4A and the fourth heating element 4B in the planar view of the second package 2, and further, the distance between the center of the circuit element 7 and the third heating element 4A and the distance between the center of the circuit element 7 and the fourth heating element 4B are made roughly equal to each other. Therefore, the heat of the third and fourth heating elements 4A, 4B is roughly evenly transferred to the circuit element 7, and it is possible to evenly and more efficiently heat the circuit element 7 with the third and fourth heating elements 4A, 4B.

Further, as shown in FIG. 7, the first and second heating elements 6A, 6B are each disposed so as not to overlap the third and fourth heating elements 4A, 4B in the planar view of the first package 5. For example, if at least a part of the first heating element 6A or the second heating element 6B overlaps the third heating element 4A or the fourth heating element 4B, there is a possibility that the second package 2 is excessively heated in the overlapping part, and there is a possibility that an excessive temperature variation (temperature gradient) occurs in the second package 2. If such a temperature variation occurs, there is a possibility that stable heating of the resonator element 3 or the circuit element is hindered. Therefore, it is not preferable for the temperature variation to occur. Therefore, by arranging the first and second heating elements 6A, 6B and the third and fourth heating elements 4A, 4B so as not to overlap each other as in the present embodiment, it is possible to stably heat the resonator element 3 and the circuit element 7. It should be noted that the first and second heating elements 6A, 6B and the third and fourth heating elements 4A, 4B can also be arranged so as to at least partially overlap each other.

Further, in the planar view of the first package 5, the first heating element 6A and the second heating element 6B are arranged side by side along a first direction X, and the third heating element 4A and the fourth heating element 4B are arranged side by side along a second direction Y crossing the first direction X. Therefore, it is possible to heat the circuit element 7 and the resonator element 3 from the four directions in the planar view of the first package 5 using the four heating elements 4A, 4B, 6A, and 6B. Thus, the circuit element 7 and the resonator element 3 can more efficiently and evenly be heated. In particular, in the present embodiment, since the first direction X and the second direction Y are perpendicular to each other, and the four heating elements 4A, 4B, 6A, and 6B are arranged symmetrically about the center of the circuit element 7 (i.e., so that the distances in the planar view from the center of the circuit element 7 are equal to each other), the advantage described above becomes more conspicuous.

Circuit Element

As shown in FIG. 5 and FIG. 6, the circuit element 7 is fixed to the bottom surface of the third recess 511c via an adhesive or the like. Further, the circuit element 7 is located at roughly the center of the first package 5 in the planar view of the first package 5. Further, the circuit element 7 is electrically connected to the internal terminals 513 via the bonding wires BW3. Such a circuit element 7 includes, for example, an oscillation circuit 71 for oscillating the resonator element 3, and a temperature control circuit 72 for controlling the operation of the heating circuits 41A, 41B based on the output of the temperature detection circuits 42A, 42B, respectively, and controlling the operation of the heating circuits 61A, 61B based on the output of the temperature detection circuits 62A, 62B, respectively. It should be noted that the temperature control circuit 72 is arranged to be able to independently control the drive of the first, second, third and fourth heating elements 6A, 6B, 4A, and 4B.

Circuit Components

As shown in FIG. 5, the circuit components 12 are disposed on the upper surface (the bottom surface of the first base 51) 5a of the first package 5. The plurality of circuit components 12 is circuit constituent parts for constituting the oscillation circuit 71 and the temperature control circuit 72 together with the circuit element 7. By disposing the circuit components 12 outside the first package 5 in such a manner, miniaturization of the first package 5 can be achieved, and the circuit element 7 and the resonator element 3 can more efficiently be heated by the first, second, third, and fourth heating elements 6A, 6B, 4A, and 4B.

It should be noted that the circuit components 12 are not particularly limited, but there can be cited, for example, a resistor element, a capacitor element, and an inductor element. Some of these circuit components have temperature-dependent characteristics. Therefore, by disposing the circuit components 12 on the upper surface 5a of the first package 5, namely by disposing the circuit components 12 and the first and second heating elements 6A, 6B so as to be opposed to each other via the first base 51, it is possible to heat the circuit components 12 with the first and second heating elements 6A, 6B, and thus it is possible to keep the circuit components 12 roughly the same in temperature as the circuit element 7, and constant in temperature. Therefore, the frequency fluctuation can effectively be suppressed to obtain the oscillator 1 having excellent frequency stability.

Interconnection Board

The interconnection substrate 8 can be formed of a known rigid printed-wiring board, and as shown in FIG. 1, includes, for example, a base 81 as a hard substance, and interconnections 82 disposed on the base 81. Further, the base 81 is provided with an opening 811, and in the opening 811, there is disposed the first package 5.

Flexible Substrate

As shown in FIG. 1, the flexible substrate 9 supports the first package 5, and at the same time, is connected to the interconnection substrate 8. The flexible substrate 9 and the first package 5 are fixed to each other via fixation members 98 having electrical conductivity, and the flexible substrate 9 and the interconnection substrate 8 are fixed to each other via fixation members 99 having electrical conductivity. Such a flexible substrate 9 can be formed of a known flexible printed-wiring board, and includes a sheet-like (film-like) base 91 having flexibility, and interconnections 92 disposed on the base 91.

The base 91 has a sheet-like shape, and includes a package mounting region 9A set in a central part of the base 91, and an interconnection substrate connection region 9B set in an edge part. Further, the first package 5 is mounted in the package mounting region 9A, and the base 91 is connected to the interconnection substrate 8 in the interconnection substrate connection region 9B. Further, the interconnections 92 are electrically connected to the respective external terminals 514 of the first package 5 via the respective fixation members 98 in the package mounting region 9A, and are electrically connected to the interconnections 82 via the respective fixation members 99 in the interconnection substrate connection region 9B. Such a flexible substrate 9 has flexibility, and can therefore be deformed in accordance with, for example, the thermal expansion of the first package 5 and the interconnection substrate 8. Therefore, it is hard for stress to be applied to the bond part between the flexible substrate 9 and the first package 5 or the interconnection substrate 8, and the reliability of the mechanical and electrical connection between the first package 5 and the flexible substrate 9, and between the interconnection substrate 8 and the flexible substrate 9 is improved. In particular, in the case of performing the temperature control of the circuit element 7 and the resonator element 3 using the first, second, third and fourth heating elements 6A, 6B, 4A, and 4B, since the temperature is significantly different between the state in which the power is applied and the state in which the power is not applied, the deformation due to the thermal expansion increases compared to the oscillator not provided with the first, second, third and fourth heating elements 6A, 6B, 4A, and 4B, and in such a case, the reliability can be exerted. Further, in the case in which an impact is applied, since the impact can be absorbed by the flexible substrate 9, the possibility of a damage of the circuit element 7 and the resonator element 3 can be reduced.

Further, in the package mounting region 9A of the base 91, there is formed an opening 911, and the circuit components 12 are disposed in the opening 911. By providing the opening 911, mounting of the circuit components 12 on the upper surface of the first package 5 is prevented from being hindered. It should be noted that as the shape of the opening 911, it is possible to adopt a closed shape not opening on the side surface of the base 91, or an open shape opening on the side surface of the flexible substrate 9.

Third Package and Pins

As shown in FIG. 1, the third package 10 houses a structure 1A constituted by the first package 5, the flexible substrate 9, and the interconnection substrate 8. Due to such a third package 10, the structure 1A can be protected.

The third package 10 includes a third base 101 having a plate shape, and a third lid 102 having a cap-like shape bonded to the third base 101, and the structure 1A is housed in a third housing space S3 formed by these constituents. The third package 10 is airtightly sealed, and the third housing space S3 is in a reduced-pressure state (no higher than 10 Pa, or preferably a vacuum state). Thus, it is possible to make the third housing space S3 function as a heat-insulating layer, and the oscillator 1 is made harder to be affected by the external temperature fluctuation. It should be noted that the atmosphere in the third housing space S3 is not limited to the above, but can be filled with an inert gas such as nitrogen or argon to be at the atmospheric pressure, or can be opened to the air.

It should be noted that the third base 101 and the third lid 102 each can be formed of, for example, a metal material or a resin material.

Further, the third base 101 is provided with a plurality of through holes, and in each of the through holes, there is inserted a pin 11 having electrical conductivity. Each of the pins 11 is formed of a hermetic terminal or the like, and the gap between the through hole and the pin 11 is airtightly sealed with a sealing material 103. Further, the pin 11 is fixed to the third base 101 with the sealing material 103. Further, each of the pins 11 is fixed to the interconnection substrate 8 at the upper end thereof, and fixes the structure 1A to the third package 10 in the state of being separated from the third package 10. Therefore, it becomes hard for the external heat to propagate to the structure 1A, and thus, the oscillator 1 hard to be affected by the external temperature fluctuation is obtained.

Further, the pins 11 are electrically connected to the interconnections 82 provided to the interconnection substrate 8. Since the lower end of each of the pins 11 is exposed to the outside of the oscillator 1, it is possible to mechanically and electrically connect the oscillator 1 to an external device such as a mother board with ease via the lower end.

Second Embodiment

Figure 8:
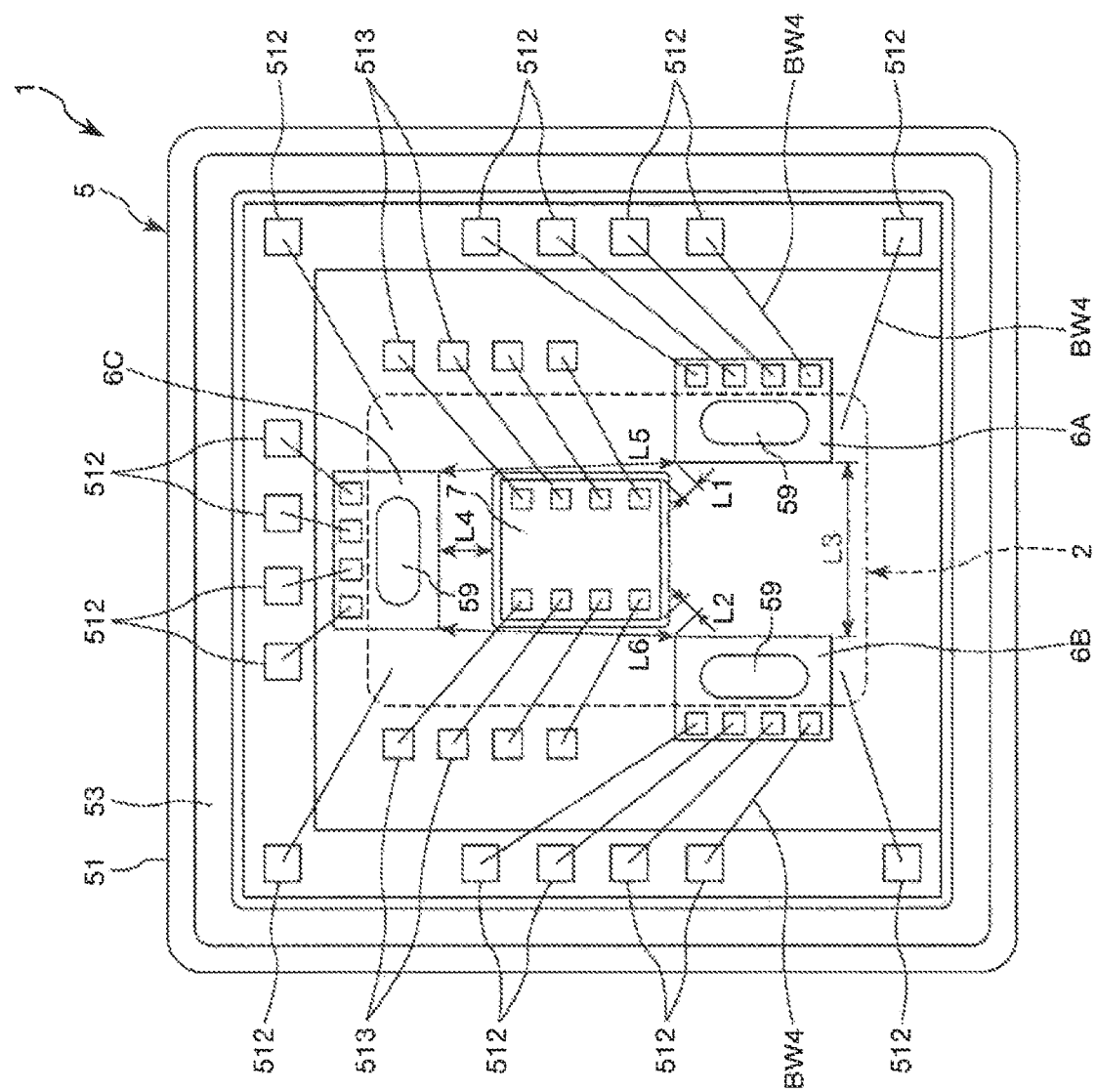
FIG. 8 is a plan view of an oscillator according to a second embodiment.

FIG. 8 is a plan view of an oscillator according to a second embodiment.

The oscillator according to the second embodiment will hereinafter be described focusing mainly on the differences from the embodiment described above, and the description of substantially the same matters will be omitted.

The oscillator according to the second embodiment is substantially the same as the oscillator according to the first embodiment described above except mainly the point that a fifth heating element disposed in the first package is included. It should be noted that in FIG. 8, the constituents substantially identical to those of the embodiment described above are denoted by the same reference symbols.

As shown in FIG. 8, in the oscillator 1 according to the present embodiment, the first package 5 is provided with the fifth heating element 6C in addition to the first and second heating elements 6A, 6B. Further, the first, second, and fifth heating elements 6A, 6B, and 6C are arranged at regular intervals in the periphery of the circuit element 7 so as to surround the circuit element 7 in the planar view of the first package 5. Further, defining the distance between the circuit element 7 and the first heating element 6A as L1, the distance between the circuit element 7 and the second heating element 6B as L2, and the distance between the first heating element 6A and the second heating element 6B as L3 in the planar view of the first package 5, the relationships of L1<L3 and L2<L3 are satisfied. According to the oscillator 1 having such a configuration, it is possible to efficiently heat the circuit element 7 with the first heating element 6A and the second heating element 6B. Therefore, it becomes possible to reduce the variation from a predetermined temperature of the circuit element 7, and thus, the oscillator 1 hard to be affected by the external temperature fluctuation is obtained.

Further, defining the distance between the circuit element 7 and the fifth heating element 6C as L4, the distance between the first heating element 6A and the fifth heating element 6C as L5, and the distance between the second heating element 6B and the fifth heating element 6C as L6 in the planar view of the first package 5, the relationships of L4<L5 and L4<L6 are satisfied. It should be noted that the arrangement of the fifth heating element 6C is not particularly limited, and the fifth heating element 6C can also be omitted.

According also to the second embodiment described hereinabove, substantially the same advantage as in the first embodiment described above can be obtained.

Third Embodiment

Figure 9:
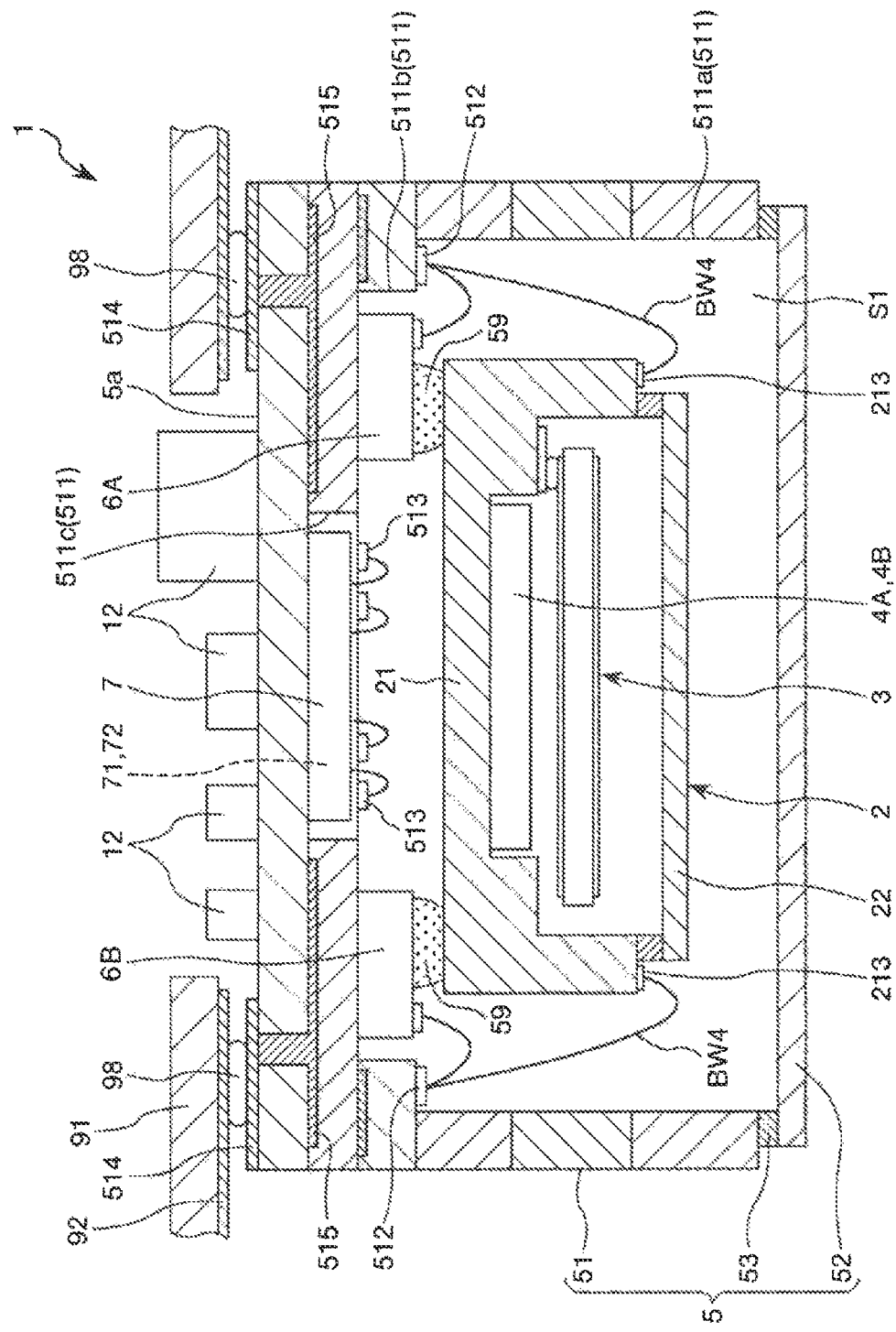
FIG. 9 is a cross-sectional view of an oscillator according to a third embodiment.

FIG. 9 is a cross-sectional view of an oscillator according to a third embodiment.

The oscillator according to the third embodiment will hereinafter be described focusing mainly on the differences from the embodiment described above, and the description of substantially the same matters will be omitted.

The oscillator according to the third embodiment is substantially the same as the oscillator according to the first embodiment described above except mainly the point that the configuration of the second package is different. It should be noted that in FIG. 9, the constituents substantially identical to those of the embodiments described above are denoted by the same reference symbols.

As shown in FIG. 9, in the oscillator 1 according to the present embodiment, the second package 2 is fixed to the first and second heating elements 6A, 6B via the fixation members 59, respectively, on the bottom surface of the second base 21. In other words, in the oscillator 1 according to the present embodiment, the second package 2 is disposed in a flipped manner compared to the configuration of the first embodiment described above. Thus, since the heat paths from the first and second heating elements 6A, 6B to the resonator element 3 can be made shorter compared to, for example, the first embodiment, it possible to more efficiently heat the resonator element 3.

It should be noted that due to such an arrangement, the external terminals 213 are disposed in a part located on the lower surface of the second base 21, and exposed from the second lid 22. By disposing the external terminals 213 in such a place, it is possible to easily wire-bond the external terminals 213 and the internal terminals 512 to each other.

According also to such a third embodiment, substantially the same advantage as in the first embodiment described above can be obtained.

Fourth Embodiment

Figure 10:
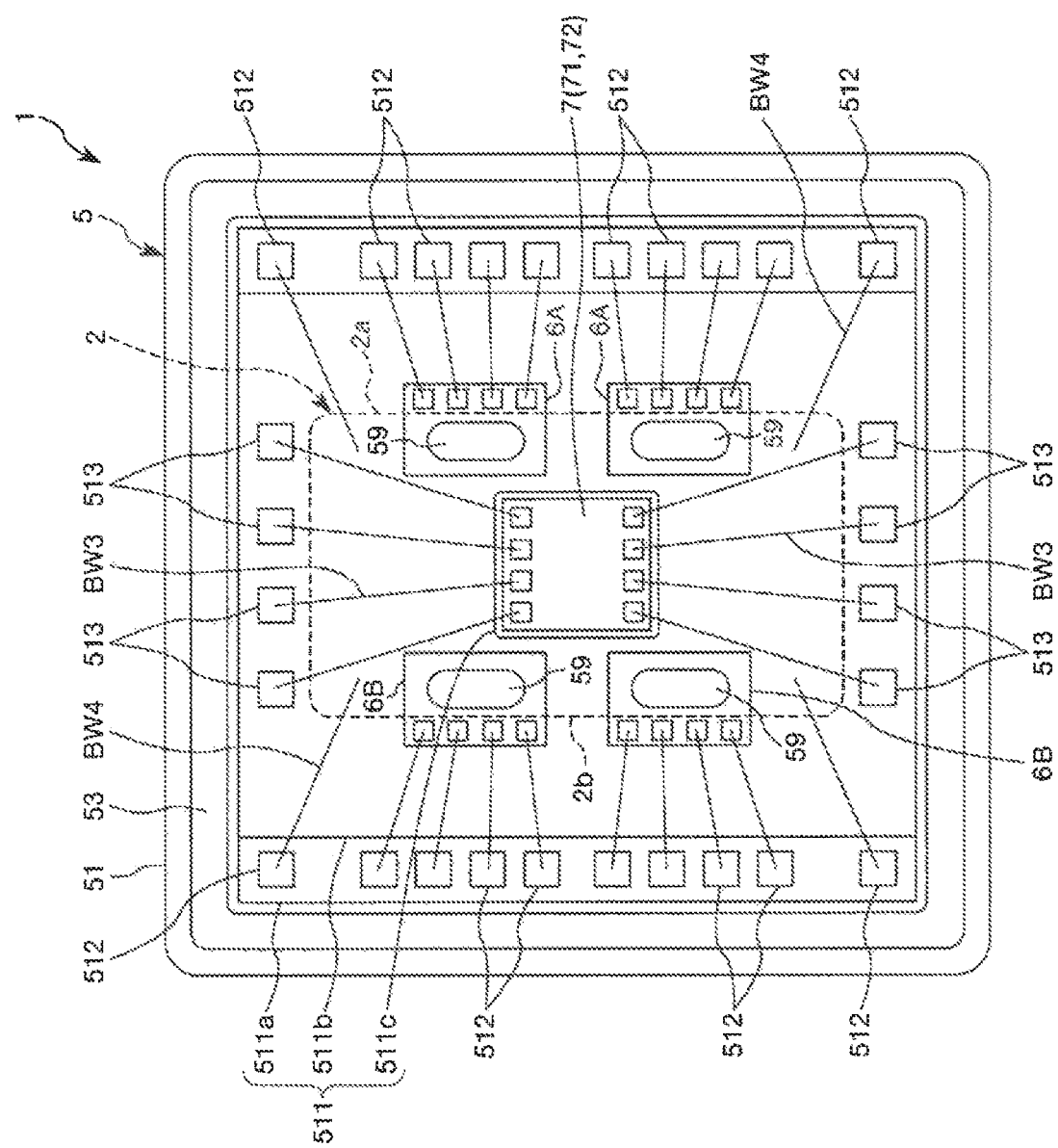
FIG. 10 is a plan view of an oscillator according to a fourth embodiment.

FIG. 10 is a plan view of an oscillator according to a fourth embodiment.

The oscillator according to the fourth embodiment will hereinafter be described focusing mainly on the differences from the embodiment described above, and the description of substantially the same matters will be omitted.

The oscillator according to the fourth embodiment is substantially the same as the oscillator according to the first embodiment described above except mainly the point that the number of the first and second heating elements is different. It should be noted that in FIG. 10, the constituents substantially identical to those of the embodiments described above are denoted by the same reference symbols.

As shown in FIG. 10, in the oscillator 1 according to the present embodiment, there are disposed two first heating elements 6A, and there are disposed two second heating elements 6B. The two first heating elements 6A are arranged side by side along the one long side 2a of the second package 2 so as to overlap the one long side 2a. In contrast, the two second heating elements 6B are arranged side by side along the other long side 2b of the second package 2 so as to overlap the other long side 2b. As described above, by arranging the first and second heating elements 6A, 6B two by two, the resonator element 7 and the circuit element 3 can more strongly be heated compared to the case in which the first and second heating elements 6A, 6B are disposed one by one as in, for example, the first embodiment described above.

According also to such a fourth embodiment, substantially the same advantage as in the first embodiment described above can be obtained.

Electronic Apparatus

Then, an electronic apparatus equipped with the oscillator according to an embodiment will be described.

Figure 11:
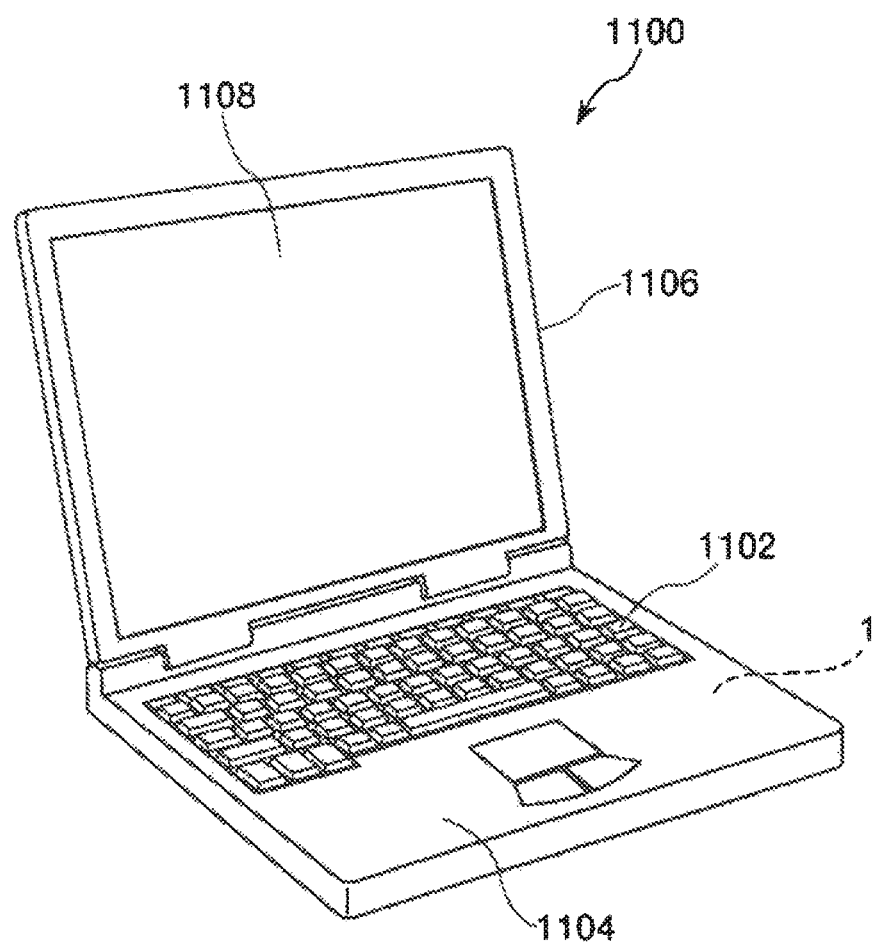
FIG. 11 is a perspective view showing a configuration of a mobile-type (or notebook-type) personal computer.

FIG. 11 is a perspective view showing a configuration of a mobile type (or a notebook type) personal computer as the electronic apparatus according to the disclosure.

In the drawing, the personal computer 1100 includes a main body 1104 provided with a keyboard 1102, and a display unit 1106 provided with a display 1108, and the display unit 1106 is pivotally supported with respect to the main body 1104 via a hinge structure. Such a personal computer 1100 incorporates the oscillator 1.

Figure 12:
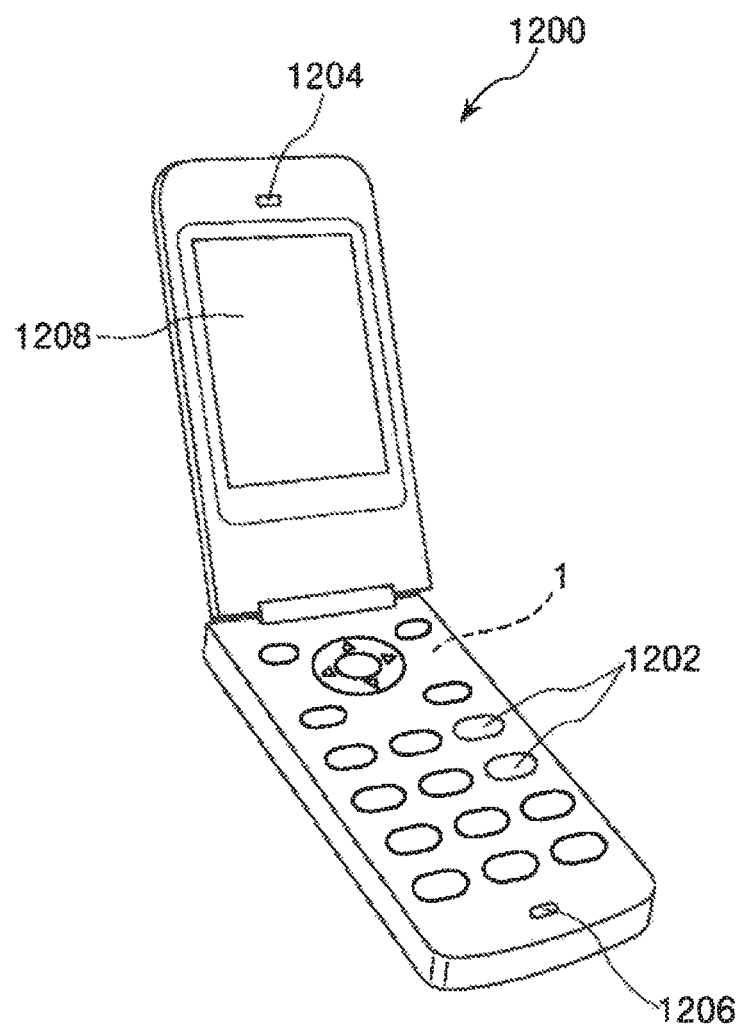
FIG. 12 is a perspective view showing a configuration of a cellular phone (including PHS).

FIG. 12 is a perspective view showing a configuration of a cellular phone (including PHS) as an embodiment of the electronic instrument according to the disclosure.

In this drawing, the cellular phone 1200 is provided with an antenna (not shown), a plurality of operation buttons 1202, an ear piece 1204, and a mouthpiece 1206, and a display 1208 is disposed between the operation buttons 1202 and the ear piece 1204. Such a cellular phone 1200 incorporates the oscillator 1.

Figure 13:
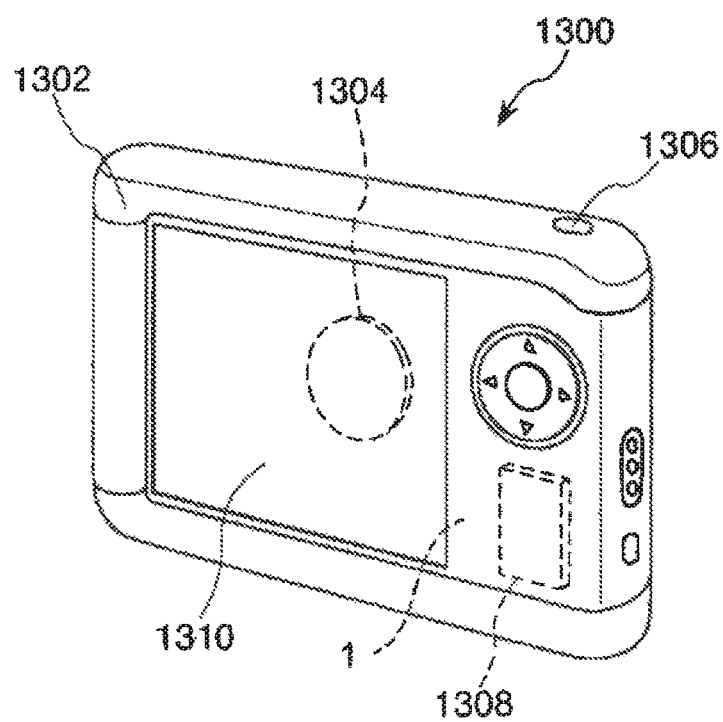
FIG. 13 is a perspective view showing a configuration of a digital still camera.

FIG. 13 is a perspective view showing a configuration of a digital still camera as the electronic apparatus according to the disclosure.

The case (body) 1302 of the digital still camera 1300 is provided with a display 1310 disposed on the back surface thereof to have a configuration of performing display in accordance with the imaging signal from the CCD, wherein the display 1310 functions as a viewfinder for displaying the object as an electronic image. Further, the front surface (the back side in the drawing) of the case 1302 is provided with a light receiving unit 1304 including an optical lens (an imaging optical system), the CCD, and so on. Then, when the photographer checks an object image displayed on the display 1310, and then presses a shutter button 1306, the imaging signal from the CCD at that moment is transferred to and stored in a memory 1308. Such a digital still camera 1300 incorporates the oscillator 1.

Since such an electronic apparatus includes the oscillator 1, the electronic apparatus can obtain the advantage of the oscillator 1 described above, and can exert the excellent reliability.

It should be noted that, as the electronic apparatus according to the disclosure, there can be cited, for example, a smartphone, a tablet terminal, a timepiece (including a smart watch), an inkjet ejection device (e.g., an inkjet printer), a laptop personal computer, a television set, a wearable terminal such as a head-mounted display (HMD), a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, a variety of types of measurement instruments, a base station apparatus for a mobile terminal, a variety of types of gauges (e.g., gauges for a vehicle, an aircraft, or a ship), a flight simulator, and a net-work server besides the personal computer shown in FIG. 11, the cellular phone shown in FIG. 12, and the digital still camera shown in FIG. 13.

Vehicle

Then, a vehicle equipped with the oscillator according to an embodiment of the disclosure will be described.

Figure 14:
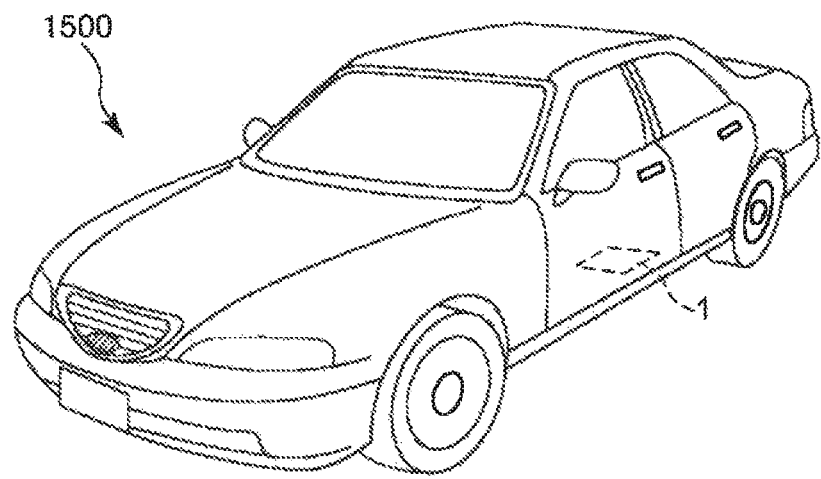
FIG. 14 is a perspective view showing a car.

FIG. 14 is a perspective view showing a car as an application of the vehicle according to the disclosure.

As shown in FIG. 14, the car 1500 incorporates the oscillator 1. The oscillator 1 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

Since such a car 1500 includes the oscillator 1, the car can obtain the advantage of the oscillator 1 described above, and can exert the excellent reliability.

Although the oscillator, the electronic apparatus, and the vehicle according to the disclosure are described based on the embodiments shown in the accompanying drawings, the disclosure is not limited to these embodiments, but the configuration of each of the constituents can be replaced with those having an identical function and an arbitrary configuration. Further, it is also possible to add any other constituents to the disclosure.

Further, although in the present embodiment described above, there is described the configuration of using the quartz crystal resonator element as the oscillation element, the oscillation element is not limited to the quartz crystal resonator, but there can be used a piezoelectric resonator element using a substrate made of an oxide such as aluminum nitride (AlN), lithium niobate (LiNbO$_3$), lithium tantalate (LiTaO$_3$), lead zirconium titanate (PZT), lithium tetraborate (Li$_2$B$_4$O$_7$), langasite (La$_3$Ga$_5$SiO$_{14}$), potassium niobate (KNbO$_3$), gallium phosphate (GaPO$_4$), gallium arsenide (GaAs), zinc oxide (ZnO, Zn$_2$O$_3$), barium titanate (BaTiO$_3$), lead titanate (PbPO$_3$), sodium potassium niobate ((K, Na)NbO$_3$), bismuth ferrite (BiFeO$_3$), sodium niobate (NaNbO$_3$), bismuth titanate (Bi$_4$Ti$_3$O$_{12}$), bismuth sodium titanate (Na$_{0.5}$Bi$_{0.5}$TiO$_3$), a layered piezoelectric substrate configured stacking the piezoelectric material such as aluminum nitride or tantalum pentoxide (Ta$_2$O$_5$) on a glass substrate, or a piezoelectric ceramics. Further, it is also possible to use a resonator element having piezoelectric element disposed on a silicon substrate. Further, the resonator element made of a quartz crystal is not limited to the SC-cut resonator element, but it is also possible to use, for example, an At-cut, a BT-cut, a Z-cut, or an LT-cut resonator element.

Further, in the present embodiment described above, there is described the configuration in which the third and fourth heating elements are provided to the second package, but it is also possible to omit at least one of the third and fourth heating elements, or to provide an additional heating element.

What is claimed is:

1. An oscillator comprising:
   a first package comprising a first base, and a first lid bonded to the first base;
   a first temperature controller housed in the first package, and mounted on the first base;
   a second temperature controller housed in the first package, and mounted on the first base; and
   a circuit element housed in the first package, mounted on the first base, and including at least a part of an oscillation circuit;
   a second package housed in the first package, and mounted on the first temperature controller and the second temperature controller via fixation members; and
   an oscillation element housed in the second package,
   wherein at least a part of the circuit element is located between the second package and the first base, and
   wherein the circuit element is disposed between the first temperature controller and the second temperature controller in a planar view.

2. An oscillator comprising:
   a first package comprising a first base, and a first lid bonded to the first base;
   a first temperature controller housed in the first package, and mounted on the first base;
   a second temperature controller housed in the first package, and mounted on the first base;
   a circuit element housed in the first package, mounted on the first base, and including at least a part of an oscillation circuit;
   a second package housed in the first package, and mounted on the first temperature controller and the second temperature controller via fixation members; and
   an oscillation element housed in the second package,
   wherein at least a part of the circuit element is located between the second package and the first base, and
   wherein defining a distance between the circuit element and the first temperature controller as L1, a distance between the circuit element and the second temperature controller as L2, and a distance between the first temperature controller and the second temperature controller as L3 in a planar view, relationships of L1<L3 and L2<L3 are satisfied.

3. The oscillator according to claim 1, wherein defining a distance between the circuit element and the first temperature controller as L1, and a distance between the circuit element and the second temperature controller as L2, a relationship of 0.9≤L1/L2≤1.1 is satisfied.

4. The oscillator according to claim 2, wherein defining a distance between the circuit element and the first temperature controller as L1, and a distance between the circuit element and the second temperature controller as L2, a relationship of 0.9≤L1/L2≤1.1 is satisfied.

5. The oscillator according to claim 1, wherein the second package comprises a second base on which the oscillation element is mounted, a second lid, and a sealing ring disposed between the second base and the second lid, and adapted to bond the second base and the second lid to each other, and the sealing ring surrounds at least a part of the circuit element in the planar view.

6. The oscillator according to claim 2, wherein the second package comprises a second base on which the oscillation element is mounted, a second lid, and a sealing ring disposed between the second base and the second lid, and adapted to bond the second base and the second lid to each other, and the sealing ring surrounds at least a part of the circuit element in the planar view.

7. The oscillator according to claim 1, further comprising:
   a third temperature controller and a fourth temperature controller housed in the second package.

8. The oscillator according to claim 2, further comprising:
   a third temperature controller and a fourth temperature controller housed in the second package.

9. The oscillator according to claim 7, wherein the circuit element is disposed between the third temperature controller and the fourth temperature controller in the planar view.

10. The oscillator according to claim 8, wherein the circuit element is disposed between the third temperature controller and the fourth temperature controller in the planar view.

11. The oscillator according to claim 7, wherein in the planar view, the first temperature controller and the second temperature controller are arranged side by side along a first direction, and the third temperature controller and the fourth temperature controller are arranged side by side along a second direction crossing the first direction.

12. The oscillator according to claim 8, wherein in the planar view, the first temperature controller and the second temperature controller are arranged side by side along a first direction, and the third temperature controller and the fourth temperature controller are arranged side by side along a second direction crossing the first direction.

13. The oscillator according to claim 4, wherein
the first package and the second package are each airtightly sealed.

14. The oscillator according to claim 1, further comprising:
an interconnection substrate; and
a flexible substrate adapted to support the first package, and connected to the interconnection substrate.

15. The oscillator according to claim 10, further comprising:
a third package adapted to house the interconnection substrate, the flexible substrate, and the first package.

16. The oscillator according to claim 9, further comprising:
a pin electrically connected to the interconnection substrate, adapted to fix the interconnection substrate to the third package, and penetrating the third package.

17. An electronic apparatus comprising:
the oscillator according to claim 1.

18. A vehicle comprising:
the oscillator according to claim 1.

* * * * *